US006543128B2

(12) United States Patent
Huang et al.

(10) Patent No.: US 6,543,128 B2
(45) Date of Patent: Apr. 8, 2003

(54) BALL GRID ARRAY PACKAGE AND ITS FABRICATING PROCESS

(75) Inventors: Chien-Ping Huang, Hsinchu Hsien (TW); Grace Yang, Taichung Hsien (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 10/122,966

(22) Filed: Apr. 11, 2002

(65) Prior Publication Data

US 2002/0111054 A1 Aug. 15, 2002

Related U.S. Application Data

(62) Division of application No. 09/454,006, filed on Dec. 3, 1999.

(51) Int. Cl.⁷ .................................................. H05K 7/10
(52) U.S. Cl. ...................................................... 29/841
(58) Field of Search ........................ 361/760; 257/738, 257/700, 779, 780, 773; 29/832, 840, 740, 841; 228/129

(56) References Cited

U.S. PATENT DOCUMENTS 5,767,575 A * 6/1998 Lan et al. .................. 257/701
5,872,399 A * 2/1999 Lee ........................... 257/668
5,973,931 A * 10/1999 Fukasawa ................... 174/255

* cited by examiner

Primary Examiner—Neil Abrams
Assistant Examiner—Phuong Dinh
(74) Attorney, Agent, or Firm—J.C. Patents

(57) ABSTRACT

A ball grid array package comprises a substrate having a first surface and a second surface, a chip, an insulating material, and a solder ball. The surface of the substrate comprises ball pads, conducting traces, and solder masks wherein the conducting traces are disposed in between the adjacent ball pads, and are covered by the solder mask, in addition, a portion of each of the ball pads is also covered by the solder mask. The solder mask includes an opening positioned in the area corresponding to the ball pads wherein the opening exposes a portion of the surface the ball pad and a portion of the side wall of the ball pad. The chip is disposed on the second surface of the substrate, and is sealed and encapsulated by the insulated material. The solder balls are disposed on the first surface of the substrate, and are positioned at the openings of the ball pads. Additionally, the solder balls are electrically connected to a portion of the surface of the ball pads and a portion of the side wall of the ball pads disposed at the ball pad openings.

5 Claims, 5 Drawing Sheets

BALL GRID ARRAY PACKAGE AND ITS FABRICATING PROCESS

CROSS-REFERENCE TO RELATED APPLICATION

This application is a divisional application of, and claims the priority benefit of, U.S. application Ser. No. 09/454,006 filed on Dec. 3, 1999.

BACKGROUND OF THE INVENTION

1. Field of the Invention

This invention relates to a ball grid array (BGA) package and its fabricating process, and more particularly to a substrate for a ball grid array package and the fabricating process of the substrate.

2. Description of Related Art

The IC (integrated circuit) packaging is the last step of the fabrication of the IC products. The purpose of the IC packaging is to provide the chip a medium for electrical connection to the PCB (Printed Circuit Board) or other appropriate devices, and additionally, to protect the chip from being damaged or short-circuit.

The IC circuit is generally encapsulated in a package and is then bonded to the PCB or other substrates, and the BGA package is one of the package structure being used very often. As the degree of integration of the IC is getting higher and higher, a lot of wires are led out, and hundreds of connections are required to constitute an integrated circuit. Therefore, it becomes necessary for the improvement on the design and fabrication process etc. of the chip carrier used for carrying the chip in order to perform packaging, and of the substrates of PCB and circuit carrier used for the connection and assembly of electronic components.

FIG. 1 is a top view of a substrate of a ball grid array package according to the prior art presented in 1994 by Intel Company with U.S. Pat. No. 5,519,580. A surface of a substrate 100 comprises a ball pad 102, a via 114, and a solder mask 110. The ball pad 102 further comprises a center area 104, and tabs 106 which is symmetrically outward extended in radial direction. The peripheral of the via 114 is provided with a via land 116 which is electrically connected to the center area 104 by a conductive connecting bar 108. The solder mask is used for covering the circuit to prevent unnecessary electrical connection. There is a ball pad opening 112 concentrically disposed with the ball pad 102 with a diameter of the ball pad opening 112 greater than that of the center area 104.

FIG. 1B is a cross-sectional view of a portion of the structure of the BGA package shown in FIG. 1A. As shown in FIG. 1B, the center area 104 on the surface 101 of the substrate 100 is positioned at the center of the ball pad opening 112, and is not covered by the solder mask 110. The solder ball 118 is disposed on the center area 104 and is connected to the surface 101 and the side wall of the ball pad 102. Thereby, the contact area between the solder ball 118 and the ball pad 108 is relatively large, consequently, a relatively more robust solder joint can be obtained. FIG. 1C shows that when the solder joint is not robust enough to sustain the external forces, the center area 104 of the ball pad 102 would crack to become cracked center area 104' and 104". Consequently, the solder ball 118 and the center area 104' would separate from the surface 101 of the substrate 100 which would result in poor reliability on the bonding between the solder ball 118 and the substrate 100.

FIG. 2A is a top view of a substrate of a ball grid array package according to the prior art presented in 1996 by Intel Company with U.S. Pat. No. 5,706,178. As shown in the FIG. 2A, elliptically shaped ball pads 202 are disposed on the substrate 200 and are parallel to the long axis. Vias 204 and 204' are also set up in the area of the ball pad 202. The solder mask 206 and the ball pad 202 are both on the same side surface of the substrate 200. And the solder mask 206 has a set-up of a ball pad opening 208 with a diameter which is equal to the short axis 212 of the elliptically shaped ball pads 202. Therefore, the ball pad opening 208 can expose a portion of the surface of the elliptically shaped ball pads 202 while the remaining portion will be covered by the solder mask 206.

FIG. 2B and FIG. 2C are the cross-sectional views of FIG. 2A along the cross-section 2B—2B and the cross-section 2C—2C respectively. Since FIG. 2B is also a cross-sectional view along the short axis 212 of the ball pad 202, the ball pad 202 is not covered by the solder mask 206, i.e. the diameter of the ball pad opening 208 (in FIG. 2A) is equal to the length of the short axis 212 of the elliptical ball pad 202. Since FIG. 2C is also a cross-sectional view along the long axis 214 of the elliptical ball pad 202, a portion of the ball pad 202 is covered by the solder mask 206, i.e. the diameter of the ball pad opening 208 (in FIG. 2A) is smaller than the length of the long axis 214 of the elliptical ball pad 202. The solder ball 216 is disposed in the ball pad opening 208, and is attached to the ball pad 202.

This type of package employs elliptically shaped ball pad 202 in order to increase the routing space available in between the ball pads, and further to raise the routing density of the conductive trace 210 in between the ball pads. A portion of the surface of the elliptical ball pad 202 is covered by the solder mask 206 which can reinforce the solder joint between the ball pad 202 and the substrate 200, and increase the peel strength of the ball pad 202. But limiting by the ball pad opening 208, there is only a surface contact without the side wall connection between the solder ball 216 and ball pad 202, therefore, the solder joint between them is not quite strong.

FIG. 3A is the top view of a type of ball pad and conductive trace arrangement on the substrate according to the prior art. There are ball pads 302, conductive traces 304, and a solder mask 306 attaching to the a substrate 300 made of Bismaleimide-Triazine (BT) resin. The spacing between the solder balls 312 is 1,270 $\mu$m (micron), and the ball pad diameter 310 is 800 $\mu$m, hence the distance between the edges of the ball pads is 470 $\mu$m. As the width 314 of the conductive trace 304 is 100 $\mu$m, at least 50 $\mu$m is needed for the spacing between each of the conductive trace 304 and each ball pad 302 and for the spacing between the adjacent conductive traces 304. Thereby, only two conductive traces 304 can be disposed between two adjacent traces 304. Consequently, the routing capability of the substrate 300 will be affected such that its routing density is unable to increase.

Additionally, FIG. 3B is a cross-sectional view of FIG. 3A along section 3B—3B. As shown in FIG. 3A and FIG. 3B, the solder mask 306 covers all over the top of substrate 300 including the conductive traces 304. The solder mask 306 also covers up to the peripheral portion of the ball pads 302, leaving only a center portion of the ball pads 302 that is exposed by the ball pad openings 308. The ball pad openings 308 having 600 $\mu$m in diameter are concentrically disposed with the ball pad 302. In this way, the anchor force of the solder mask 306 covering the peripheral portion of the solder pads 302 can strengthen the solder joint between the solder pads 302 and the substrate 300. The solder balls 320 are attached to the ball pad 302 through the ball pad openings 308. Similar to the situation in FIG. 2B, limiting by the dimension of the ball pad opening 308, there is only a surface contact without the side wail connection between the solder ball 320 and ball pad 302, therefore, the solder joint between them is not quite strong.

What is more, shown in FIG. 3C is the top view of another type of ball pad and conductive trace arrangement on the substrate according to the prior art. Similar to those in FIG. 3A, same component numbers are used in FIG. 3C. As shown in FIG. 3C, three conductive traces 304' can be disposed in between the adjacent ball pads 302 if the width 314' of the conductive traces 304' is reduced down to 90 μm rather than 100 μm as shown in FIG. 3A. In this way, the routing density can be increased only that reducing the width of the conductive traces requires raising the manufacturing capability of the substrate, besides, the manufacturing cost will also be increased.

SUMMARY OF THE INVENTION

It is therefore an objective of the present invention to provide a ball grid array package and its fabricating process wherein the packaging substrate is high in routing capability, high in routing density, and low in manufacturing cost. This type of the package is robust in solder joint between the solder balls and ball pads, and good in solderability. In additions, since the ball pads are anchored on the substrate, the solder balls and the ball pads as a whole is relatively high in reliability with respect to the substrate.

In order to attain the foregoing objectives, the present invention provides a ball grid array package comprising a substrate having a first surface and a second surface, a chip, an insulating material, and a solder ball. Disposed on the first surface are solder balls, ball pads, and conductive traces wherein the conductive traces are disposed in between each of the two adjacent ball pads. The solder mask covers all the traces and a portion of each of the ball pads. Moreover, ball pad openings are set up in the area of the solder mask corresponding to the locations of the ball pads wherein the solder pad openings expose a portion of each of the ball pads and their side wall. Then, the chip is disposed on the second surface and is sealed and encapsulated by the insulating material. What is more, the solder balls are disposed on the first surface of the substrate and are located in the ball pad openings. Finally, the solder balls are electrically connected to a portion of the surface of each of the ball pads and their side wall exposed by the ball pad openings.

Additionally, in order to attain the foregoing objectives, the present invention provides a fabricating process of a ball grid array package. Firstly, a substrate is provided for carrying the chip. Ball pads and conductive traces between the adjacent ball pads are formed on the substrate. Next, a solder mask is formed on the first surface of the substrate by using a solder resist to cover the conductive traces and a portion of the ball pads. Then, ball pad openings are set up in the area of the solder mask corresponding to locations of the ball pads wherein the solder pad openings expose a portion of each of the ball pads and their side wall. Consequently, the chip is disposed on the second surface of the substrate and is electrically connected to the substrate, then is sealed and encapsulated by an insulating material. Finally, the solder balls are disposed at the ball pad opening of the solder mask on the first surface of the substrate and are positioned, and are electrically connected to the ball pads and their side wall exposed by the ball pad openings.

BRIEF DESCRIPTION OF DRAWINGS

The objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 1A:
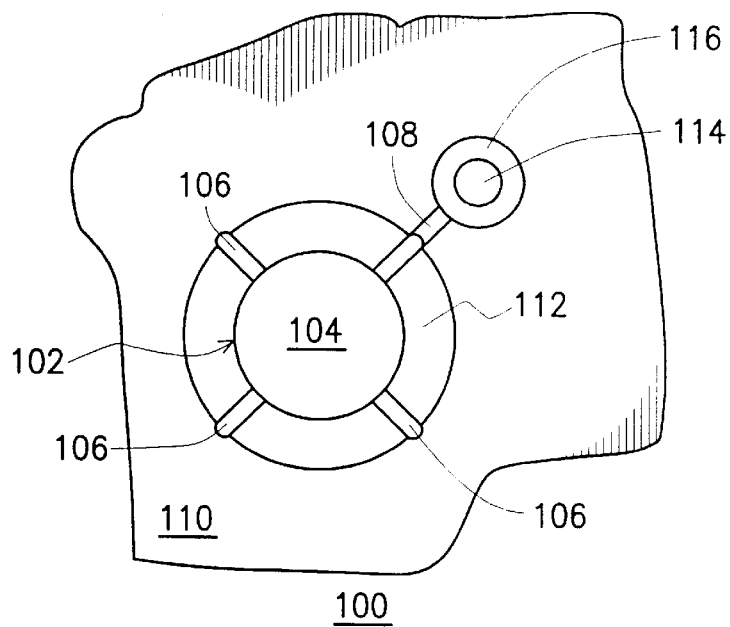
FIG. 1A is a top view of a ball grid array package according to the prior art.
Figure 1B:
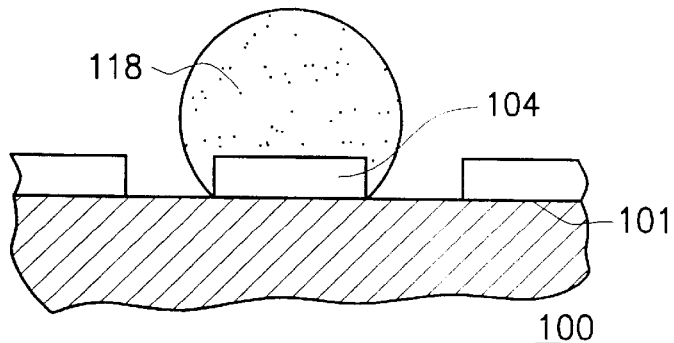
FIG. 1B is a partial cross-sectional view of the ball grid array package shown in FIG. 1A.
Figure 1C:
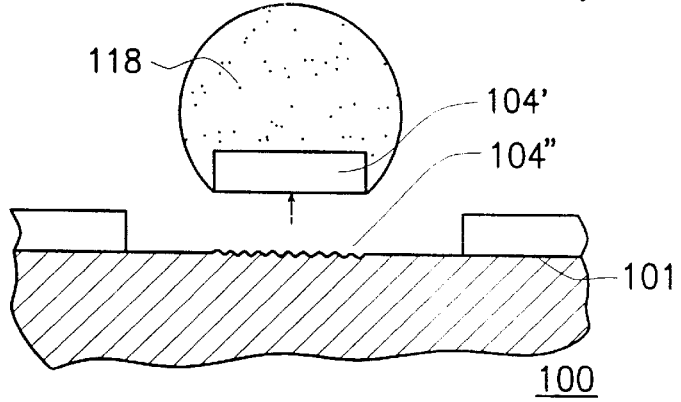
FIG. 1C is a schematic drawing showing a solder ball with a mounted ball pad is cracked and separated from a substrate of a ball grid array package shown in FIG. 1A.
Figure 2A:
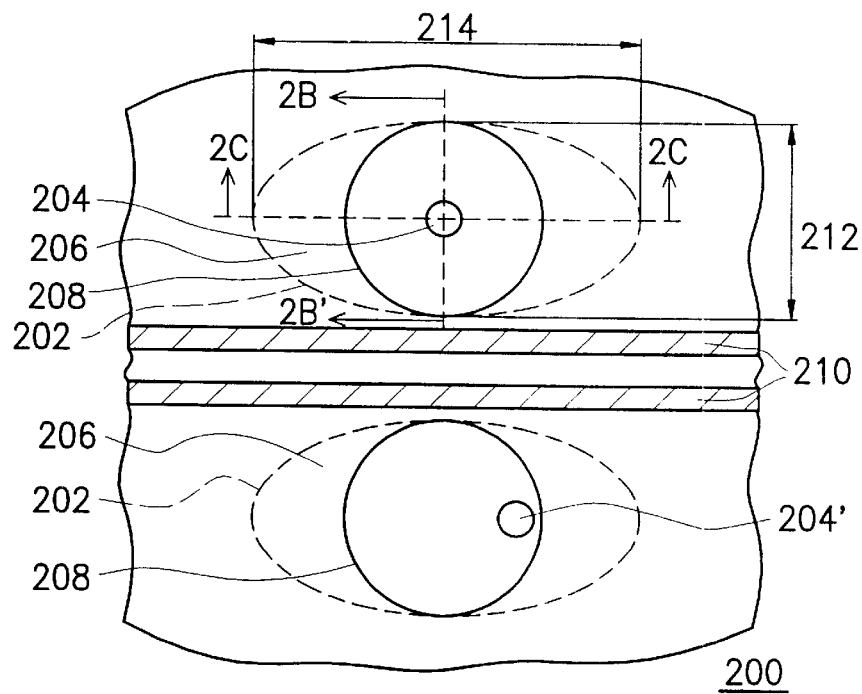
FIG. 2A is a top view of another ball grid array package according to the prior art.
Figure 2B:
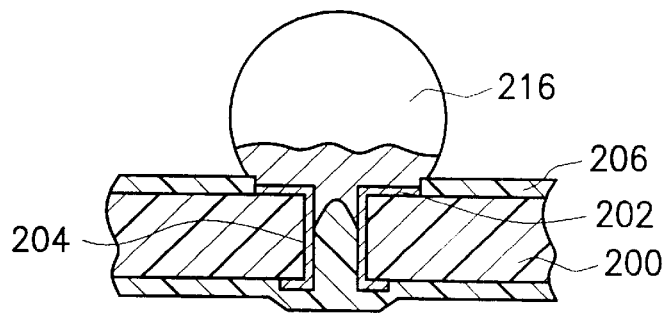
FIG. 2B and FIG. 2C are cross-sectional views along the cross-section of 2B—2B and 2C—2C shown in FIG. 2A
Figure 2C:
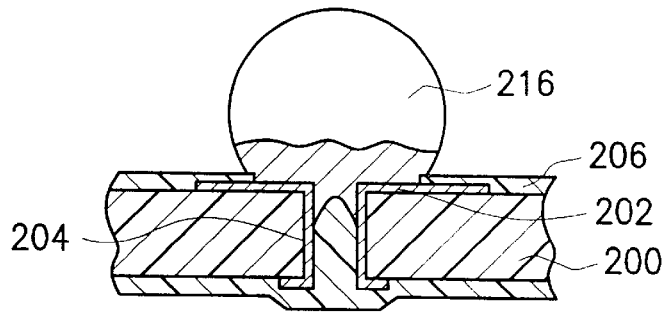
Figure 3A:
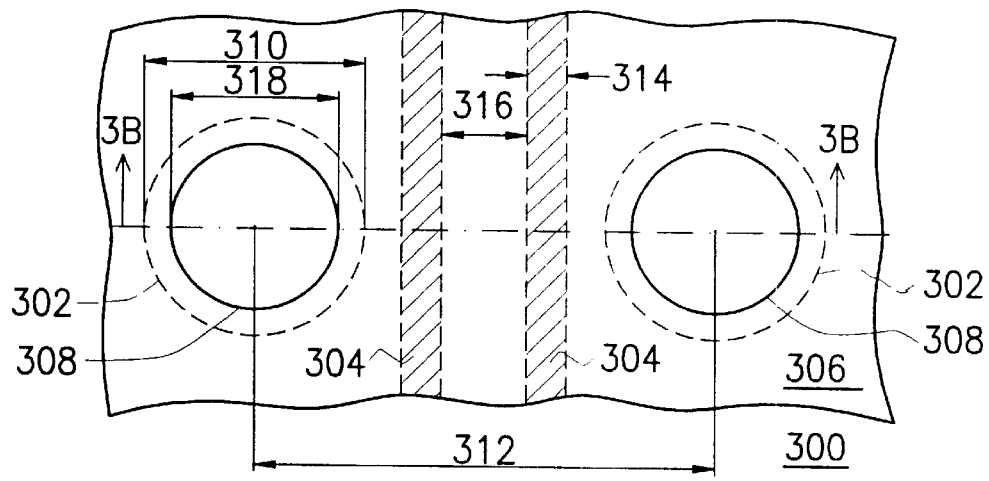
FIG. 3A is a top view of an arrangement of ball pads and conductive traces on the substrate of a ball grid array package according to the prior art.
Figure 3B:
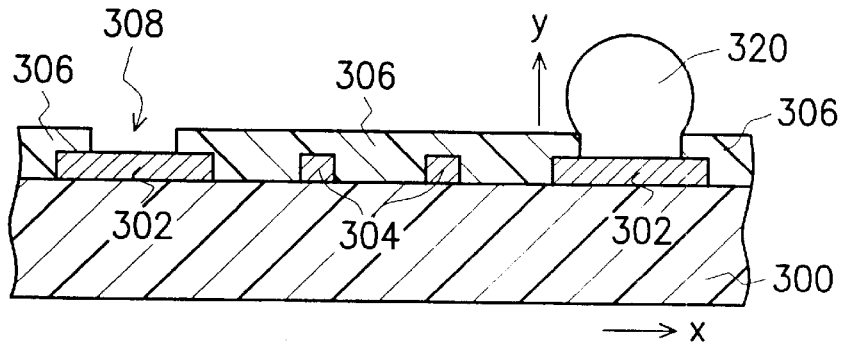
FIG. 3B is a cross-sectional view of the ball grid array package along the cross-section of 3B—3B shown in FIG. 3A.
Figure 3C:
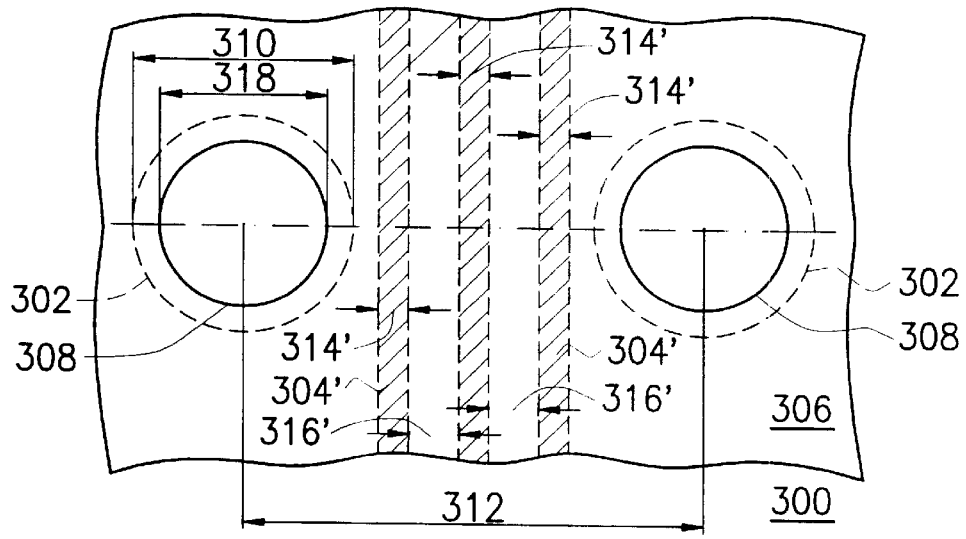
FIG. 3C is a top view of another arrangement of ball pads and conductive traces on the substrate of a ball grid array package according to the prior art.
Figure 4A:
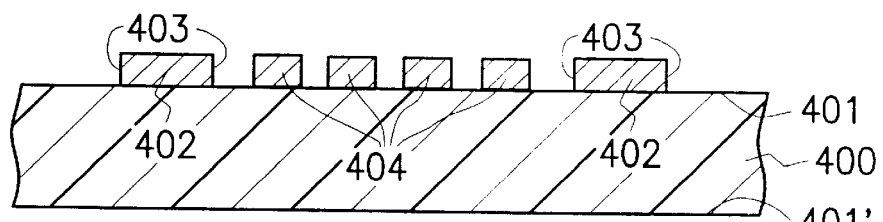
FIG. 4A to FIG. 4D are schematic cross-sectional views of a ball grid array package and its fabrication process of a preferred embodiment in accordance with the present invention.

Shown in FIG. 4A to FIG. 4D are schematic cross-sectional views of a ball grid array package and its fabrication process of a preferred embodiment according to the present invention. As shown in FIG. 4A, firstly, a plurality of ball pads 402 and conductive traces 404 are formed on a first surface 401 of a substrate 400 provided for carrying the chip wherein the conductive traces 404 are disposed in between the adjacent ball pads 402. The substrate 400 can employ a prepreg made of hard resin having high "glass transition temperature. The material includes "Glass Epoxy Resin", "Bismaleimide-Triazine" (BT) etc., such as FR-4 substrate, FR-5 substrate, and BT substrate etc. while the material used for ball pads 402 and conductive traces 404 include copper and other electrically conductive material.

Figure 4B:
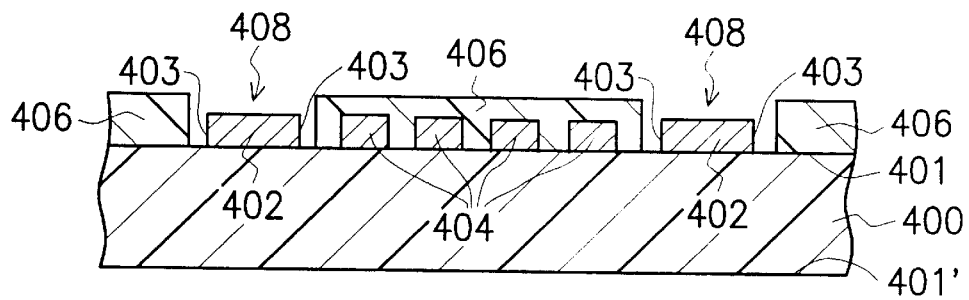

Next, as shown in FIG. 4B, a solder resist is coated on the first surface 401 having ball pads 402 and conductive traces 404 to form a solder mask 406 in order to cover all the conductive traces 404 and a portion of each of the ball pads 402. Ball pad openings 408 which exposes a portion of the surface of the ball pads 402 and their side wall 403 are set up on the solder mask 406 in the area corresponding to the ball pads 402.

Shown in FIG. 4B, the material for forming the solder mask 406 is an insulating material including the green paint of "Ultra Violet Ray" type and the green paint of "Heat-Hardening" type. The ways of coating the green paint for forming the solder mask includes roller coating, curtain coating, screen printing, dip method, and dry film method etc. The way for forming the solder mask 406 is to use the green paint of "Ultra Violet Ray" type to first coat the green paint on the first surface 401. It is then to go through the process of first drying, exposure, developing, and second drying to form the solder mask 406. As for the way for forming the solder mask 406 by using the green paint of "Heat-Hardening" type, it is to coat the green paint on the first surface 401 in accordance with the solder mask pattern. It is then to go through the drying process to make it become harden to form the required solder mask 406.

Figure 5:
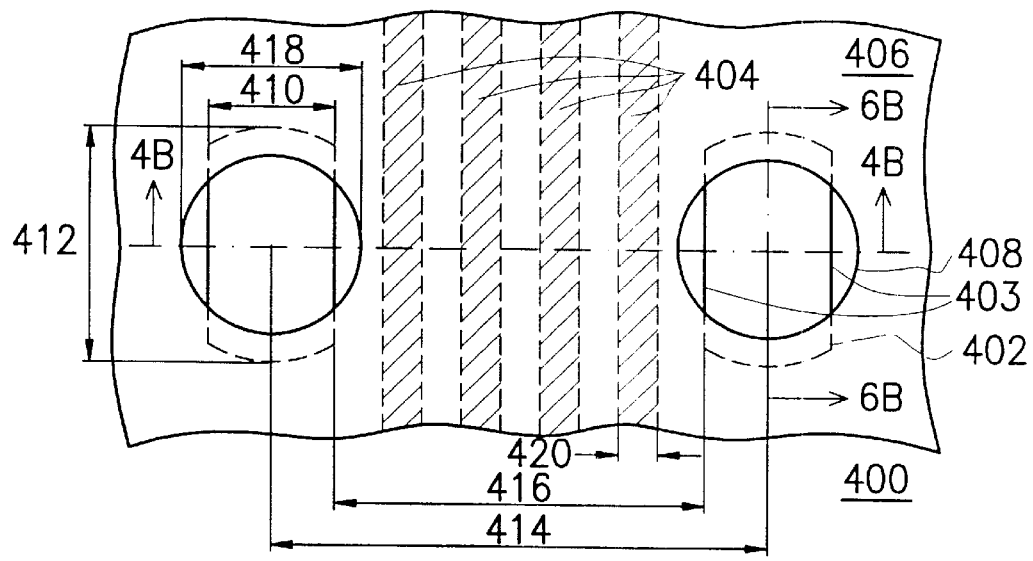
FIG. 5 is a top view of an arrangement of the ball pads and the conductive traces on the substrate of a ball grid array package of a preferred embodiment in accordance with the present invention.

FIG. 5 is a top view of an arrangement of the ball pads and the conductive traces on the substrate of a ball grid array package of a preferred embodiment in accordance with the present invention. FIG. 4B is a cross-sectional view along the cross-section 4B—4B as shown in FIG. 5. As shown in FIG. 5 accompanied with FIG. 4B, ball pads 402, conductive traces 404, and the solder mask 406 are mounted on the first surface 401 of the substrate 400 wherein the ball pad 402 has its characteristic dimension of width 410 and length 412. There is a center distance 414 and edge distance 416 between the adjacent ball pads 402, besides, a diameter 418 for the ball pad opening 408 of the solder mask 406, and a specific width 420 for the conductive trace 404. The ball pads 402 and the ball pad openings 408 of the solder mask 406 are one-to-one correspondent, and a portion of the ball pad 402 and their side wall 403 are exposed at the ball pad opening 408.

For example, as shown in FIG. 5, the center distance 414 between the adjacent ball pads is around 1,270 μm, while the width 410 and the length 412 of the ball pad are 500 μm and 800 μm respectively. Also, since the width 420 of the conductive trace is around 100 μm and the diameter 418 of the ball pad opening is around 600 μm, thereby, roughly four conductive traces 404 can be disposed between two adjacent ball pads 402. This can double the routing density of the conductive traces 404. At least 50 μm of a spacing must be kept between the two adjacent conductive traces 404 and between a conductive trace 404 and its adjacent ball pad 402. And since the actual distance between the two adjacent conductive traces 404, also the actual distance between a conductive trace 404 and its adjacent ball pad 402 is around 74 μm, the requirement that the spacing is greater than 50 μm is met. Therefore, the available routing space between the ball pads 402 can be increased, and the routing capability and the routing density of the substrate can thus be increased by diminishing the width of the ball pad.

Although the ball pads 402 shown in FIG. 5 are in a strip shape and the ball pad openings 408 are in round shape, the ball pads 402 and the ball pad openings 408 in this embodiment of the present invention can be of any different shapes. Therefore, the shapes of the ball pads 402 and the ball pad openings 408 as shown in FIG. 5 shall not be considered as any limitation to the scope of the present invention. In additions, the ball pads 402, the conductive traces 404, and the openings 408 on the solder mask 406 can have various types of arrangement in accordance with the requirements of electrical connection and joint number. Therefore, the present invention is in no way limited to the details of such embodiment shown in FIG. 5.

Figure 4C:
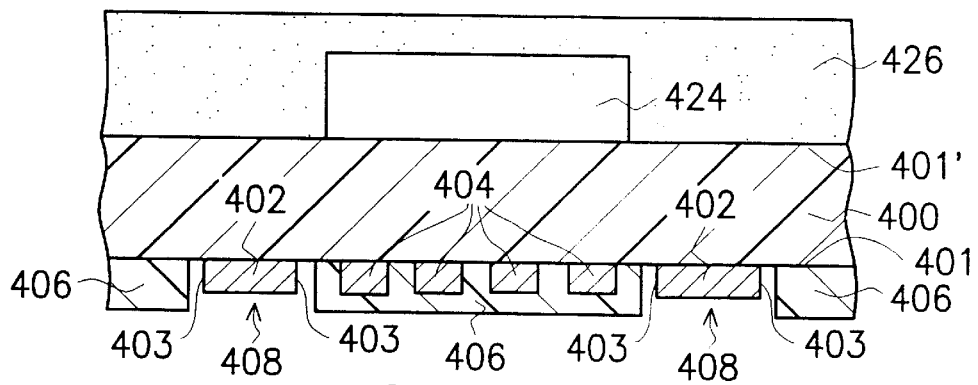

FIG. 4C illustrates the electrical connection between the chip 424 and the substrate 400. The electrical connection between the chip 424 and the bonding pads (not shown) of the substrate 400 can be achieved by employing wire bonding (WB), Tape Automated Bonding (TAB), or Flip Chip (FC). Thereafter, the Molding process is performed to encapsulate and seal the chip 424 by the use of an insulating material 426 including Resin, Epoxy etc. The molding process is performed only on the second surface 401' and is not on the first surface of the substrate 400, thereby, the first surface 401 is not encapsulated by the insulating material 426.

Figure 4D:
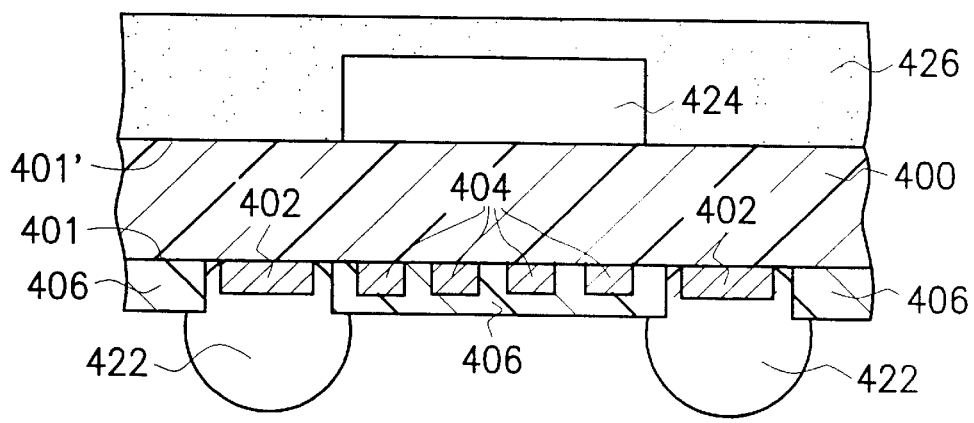

FIG. 4D illustrates the ball planting process. The solder balls 422 are planted on the first surface 401 of the substrate 400 and are disposed at the ball pad openings (408 in FIG. 4C). The solder balls 422 are electrically connected to a portion of the surface and a portion of the side wall (403 in FIG. 4C) of the ball pads 402 exposed by the ball pad openings 408 to accomplish the fabrication of the ball grid array package. These solder balls 422 are used as a medium of electrical connection of the ball grid array package to the external printed circuit board (PCB) or to the other devices.

Figure 6A:
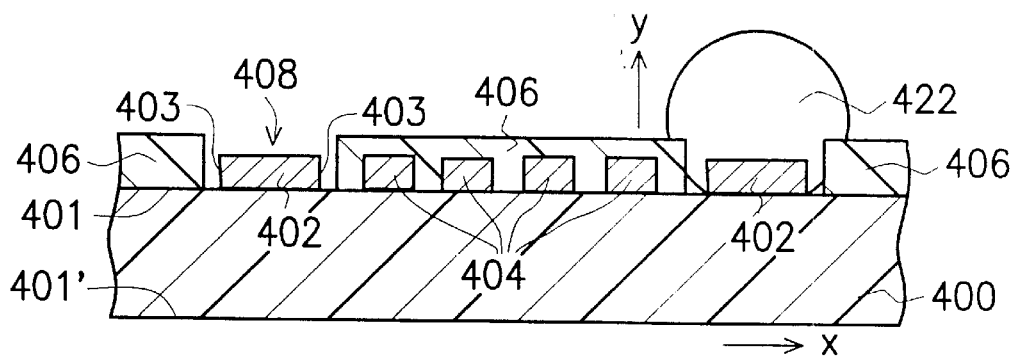
FIG. 6A and FIG. 6B are cross-sectional views along the cross-section of 4B—4B and 6B—6B respectively as shown in FIG. 5.
Figure 6B:
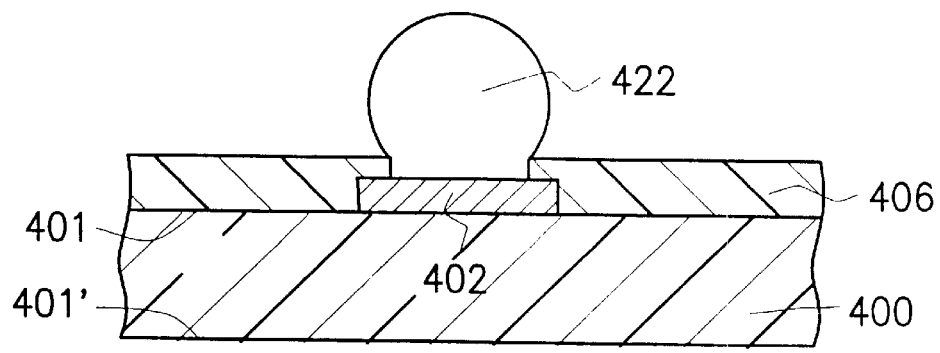

FIG. 6A and FIG. 6B are cross-sectional views along the cross-section of 4B—4B and 6B—6B respectively as shown in FIG. 5. As shown in FIG. 6A, a portion of the side wall 403 of the ball pads 402 is exposed through the ball pad openings 408, that is, the diameter 418 of the ball pad opening 408 is greater than the width 410 of the ball pad 402. The solder balls 422 disposed on the first surface 401 are connected to a portion of the surface of the ball pad 402 and a portion of the side wall 403. In the present invention, the connection between the solder balls 422 and the ball pads 402 is not limited to the surface contact, but there is also a contact on the side wall. Therefore, a relatively stronger solder joint can be obtained and higher bonding reliability can be achieved as compared with those of the prior art in which the solder balls are connected only to the surface of the ball pads.

As shown in FIG. 6B, since a portion of the ball pads 402 is covered by the solder mask 406, the diameter 418 of the ball pad opening 408 is smaller than the length 412 of the ball pad. The solder balls 422 are disposed at the ball pad openings (408 in FIG. 5) and connected to the ball pads 402. As the solder mask 406 covers a portion of the surface of the ball pads 402, the solder mask 406 can anchor the ball pads 402 on the first surface 401 of the substrate 400. In this way, the solder joint between the ball pads 402 and the substrate 400 can be reinforced and the peeling strength between them can be enhanced. Thereby, the bonding reliability between the integral body, which includes the solder balls 422 and ball pads 402, and the first surface 401 of the substrate 400 can be increased.

To summarize the foregoing statement, the present invention comprises at least the following advantages:

1. The ball grid array package of the present invention can disposes relatively higher number of conductive traces between the ball pads to increase the routing capability and routing density of the substrate. This is because that the ball grid array package of the present invention uses the method of diminishing the width of the ball pad on the substrate to increase the routing space available between the ball pads.
2. The ball grid array package of the present invention can have a relatively higher strength and higher bonding reliability in the solder joint between the solder ball and the ball pad. This is due to the fact that the solder ball contact the ball pad in both the horizontal and vertical direction, that is, the solder ball contact not only the surface but also the side wall of the solder pad. The reason is that since the width of the ball pad is small than the diameter of the ball pad opening of the solder mask, thereby, a portion of the side wall is exposed through the ball pad opening.
3. The ball grid array package of the present invention can reinforce the solder joint, increase the peeling strength, and raising the bonding reliability between the integral body, which includes the solder ball and the ball pad, and the substrate. This is due to the fact that the length of the ball pad is greater than the diameter of the ball pad opening of the solder mask, thereby, the solder mask can cover a portion of the ball pad to generate an anchoring action.

Therefore, using the ball grid array package and its fabrication process of the present invention can increase the routing density of the substrate and raise the bonding reliability between the integral body, which includes the solder ball and the ball pad, and the substrate without increasing the fabricating cost.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A fabricating process of a ball grid array package comprising:

forming a substrate, having a first surface and a second surface;

forming a plurality of ball pads and a plurality of conducting traces on the first surface, wherein those conducting traces are disposed in between each of the two adjacent ball pads, and wherein each of the ball pad has a side wall, and is striped-shaped with a length and a width that is smaller than the length so that the number of conductive traces between each two adjacent striped ball pads is increased;

forming a solder mask having a plurality of openings on the first surface to cover those conducting traces and a portion of each of those ball pads wherein each of the openings correspond to each of the ball pads, and exposing respectively a portion of the surface and the side wall of each of those ball pads;

attaching a chip on the second surface and electrically connecting the chip to the substrate; and forming an insulating material on the second surface to encapsulate the chip and the second surface.

2. The fabricating process of a ball grid array package of claim 1 further comprising a plurality of solder balls disposed respectively in the openings, and each of those solder balls is electrically connected to a portion of the surface of each of the ball pads and a portion of the side wall.

3. The fabricating process of a ball grid array package of claim 1 wherein the center distance between each of two adjacent ball pads formed is around 1,270 $\mu$m, and the width of the ball pads formed is around 500 $\mu$m, while the width of the opening formed is around 600 $\mu$m.

4. The fabricating process of a substrate for a ball grid array package comprising:

providing a substrate having a surface;

forming a plurality of stripe-shaped ball pads and a plurality of conducting traces on the surface, wherein each of the stripe-shaped ball pads is arranged that at least four conductive traces are disposed between each two adjacent stripe-shaped ball pads; and forming a solder mask having a plurality of openings on the surface to cover those conducting traces and a portion of each of those ball pads wherein each of the openings corresponding to each of the ball pads, and exposing respectively a portion of the surface and the side wall of each of those ball pads.

5. The fabricating process of a substrate for a ball grid array package of claim 4 wherein the center distance between each of two adjacent ball pads formed is around 1,270 $\mu$m, and the width of the ball pads formed is around 500 $\mu$m, while the width of the opening formed is around 600 $\mu$m.

* * * * *